United States Patent
Henningsson et al.

[11] Patent Number: 6,000,956
[45] Date of Patent: Dec. 14, 1999

[54] CONTACT SPRING

[75] Inventors: Uno Henningsson, Nynäshamn; Michael Lynn, Sollentuna, both of Sweden

[73] Assignee: Telefonaktiebolaget LM Ericsson, Stockholm, Sweden

[21] Appl. No.: 09/026,728

[22] Filed: Feb. 20, 1998

Related U.S. Application Data

[63] Continuation of application No. PCT/SE96/01034, Aug. 21, 1996.

[30] Foreign Application Priority Data

Aug. 21, 1995 [SE] Sweden .................................. 9502894

[51] Int. Cl.$^6$ ..................................................... H01R 4/66
[52] U.S. Cl. ........................... 439/95; 361/799; 439/76.1
[58] Field of Search .............................. 439/95, 76.1, 92; 174/35 GC; 361/799, 753

[56] References Cited

U.S. PATENT DOCUMENTS

| | | | |
|---|---|---|---|
| 5,124,889 | 6/1992 | Humbert et al. | |
| 5,250,751 | 10/1993 | Yamaguchi | 174/35 GC |
| 5,430,618 | 7/1995 | Huang | 361/818 |
| 5,434,747 | 7/1995 | Shibata | 361/753 |
| 5,451,167 | 9/1995 | Zielinski et al. | 439/92 |
| 5,600,092 | 2/1997 | Patscheck et al. | 174/35 |
| 5,696,669 | 12/1997 | Bassler et al. | 361/816 |

FOREIGN PATENT DOCUMENTS

| | | |
|---|---|---|
| 124 701 | 11/1984 | European Pat. Off. . |
| 447 942 | 9/1991 | European Pat. Off. . |
| WO95/28074 | 10/1995 | WIPO . |

*Primary Examiner*—Paula Bradley
*Assistant Examiner*—Truc Nguyen
*Attorney, Agent, or Firm*—Burns, Doane, Swecker & Mathis, L.L.P.

[57] ABSTRACT

A connector spring has a longitudinal spring in one piece according to the following. A first substantially strip-shaped body portion extends along the longitudinal direction of the spring structure. A second body portion extends along and at a distance from the first strip portion and is connected thereto by arcuate connection pieces, which extend from a first side edge of one of the body portions to an adjacent first side edge of the other body portion. First contact tongues are bent from the first side edge of the second body portion in direction towards the other body portion and ends between the planes of the two body portions. Second contact tongues are bent from the first side edge of the first body portion in direction towards the other body portion and ends outside the plane of the second body portion. Third contact tongues are bent from the other side edge of the first body portion in direction outwardly from the two body portions.

7 Claims, 3 Drawing Sheets

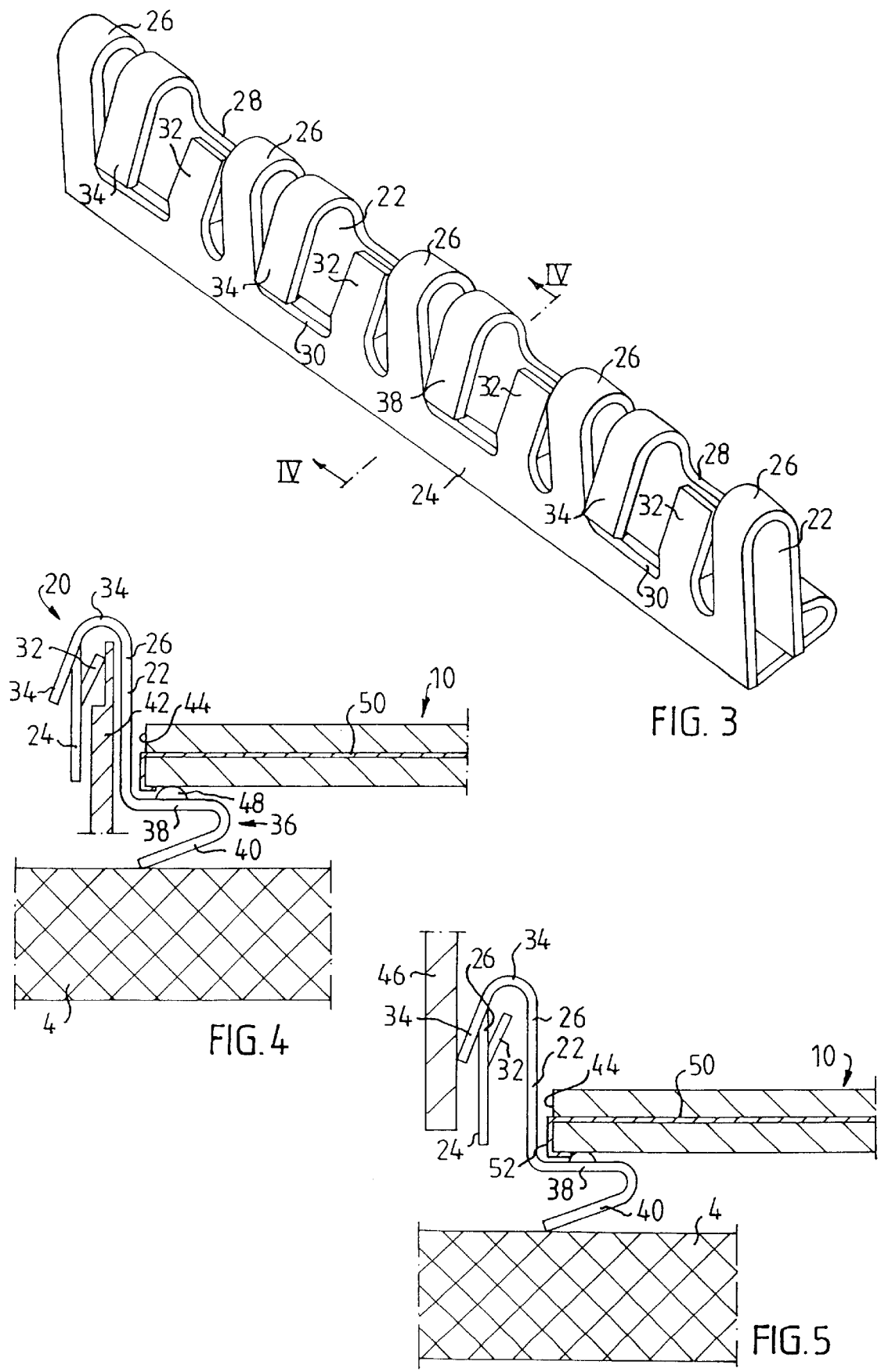

CONTACT SPRING

This application is a continuation of International Application No. PCT/SE96/01034, which was filed on Aug. 21, 1996, which designated the United States, and which is expressly incorporated here by reference.

BACKGROUND

The present invention generally relates to a contact spring consisting of a longitudinal spring means, in particular for use in an electro-optic circuit.

An electro-optic circuit is known that comprises optic sender and receiver components for transforming an electric output signal to an outgoing optic signal and for transforming a received optic signal to an electric input signal, respectively, connection means for an opto conductor on which the outgoing and received optic signals are transmitted, a sender for the electric output signal, and a receiver for the electric input signal.

Electro-optic circuits of this kind are used e.g. located on a printed circuit card in a telecommunication switch. Each circuit card carries a plurality of such electro-optic circuits and in the switch one or more cabinets can contain a plurality of shielded card magazines, each of which contains a plurality of such circuit cards. For increasing the insensitivity towards EMC, i.e. electromagnetical disturbance radiation, senders and receivers are conventionally located far in on the card as seen from its edge located at an outer cabinet wall, below denominated card front. On the card front there are seated a number of connection devices for connecting an outer opto conductor to two opto conductors leading to the sender and receiver, respectively, of a corresponding sender/receiver pair. For minimizing the risk for interference between sender and receiver of each sender/receiver pair the sender and the receiver are furthermore located remote from each other on the card.

This distribution of the components of the electro-optic circuit counteracts a striving for a more compact architecture of switches of the just described type, while saving or further improving the insensitiveness for EMC, as well as ESD, i.e. electrostatical discharges.

To take care of this it has turned out to be advantageous that the individual circuit forms a module with an electromagnetically shielded housing that contains the optical sender and receiver components and connection means for the opto conductor, and that a two-sided printed circuit arrangement carries the sender and the receiver located shielded from each other on one side each by means of an electrically conducting shielding that is in connection with the housing for forming three Faraday's cages, one for the sender, one for the receiver and one formed of the housing in its entirety.

In an arrangement of the kind just mentioned it is essential that an intimate contact is maintained between grounding parts of the housing parts by contact means taking up the least possible space.

In EP-124701 there is described a device for contact making of printed circuit cards introduced into brackets, in particular for providing ground connection between a housing and the printed circuit card. It includes a spring clip that surrounds the edge of the printed circuit card and is provided with clawlike extensions which engage the contact surfaces of the printed circuit card and which, when the printed circuit card is inserted in the bracket, is in electric contact with this.

EP-447942 describes a contact rib of metallic material for fitting on the edge of a metallic wall element, in order to provide an interference radiation tight connection. The contact rib has a row of individual contact tongues which are stamped free and outwardly bent from the contact rib plane at a distance from each other, and a row of individual clamp elements distributed at a distance from each other along their lengths.

SUMMARY

One object of the invention is to provide a contact spring consisting of a longitudinal spring means that is simple and cheap to manufacture, and particularly is usable as a contact spring module of which a number can be used for contact making between grounding parts of a component housing composed of two separate parts, such as in an electro-optic circuit of the kind discussed above.

This object has been attained in that the longitudinal spring means is shaped in one piece with a first substantially strip shaped web portion that extends along the longitudinal direction of the spring means, a second web portion extending along and at a distance from the first web portion and being united with this by means of arcuate connection pieces which extend from a first side edge of one of the web portions to an adjacent first side edge of the other web portion, first contact tongues bent from the first side edge of the second web portion in a direction towards the second web portion and ending between the planes of the two web portions, second contact tongues arcuately bent from the first side edge of the first web portion in a direction towards the second web portion and ending outside the plane of the second web portion, third contact tongues bent from the second side edge of the first web portion in a direction outwardly from the two web portions.

DESCRIPTION OF DRAWINGS

The invention will now be described more closely with reference to the attached drawings, on which FIG. 3 shows a perspective view of a contact spring module according to the invention used in the housing and intended to be used between different elements, forming parts of the housing according to FIG. 1, a printed circuit card introduced in the housing and the mother card, FIGS. 4 and 5 show sections in the direction of arrows IV—IV in FIG. 3 through the contact spring module for illustrating cooperation thereof with the elements shown in FIG. 3.

DETAILED DESCRITPION

Figure 1:
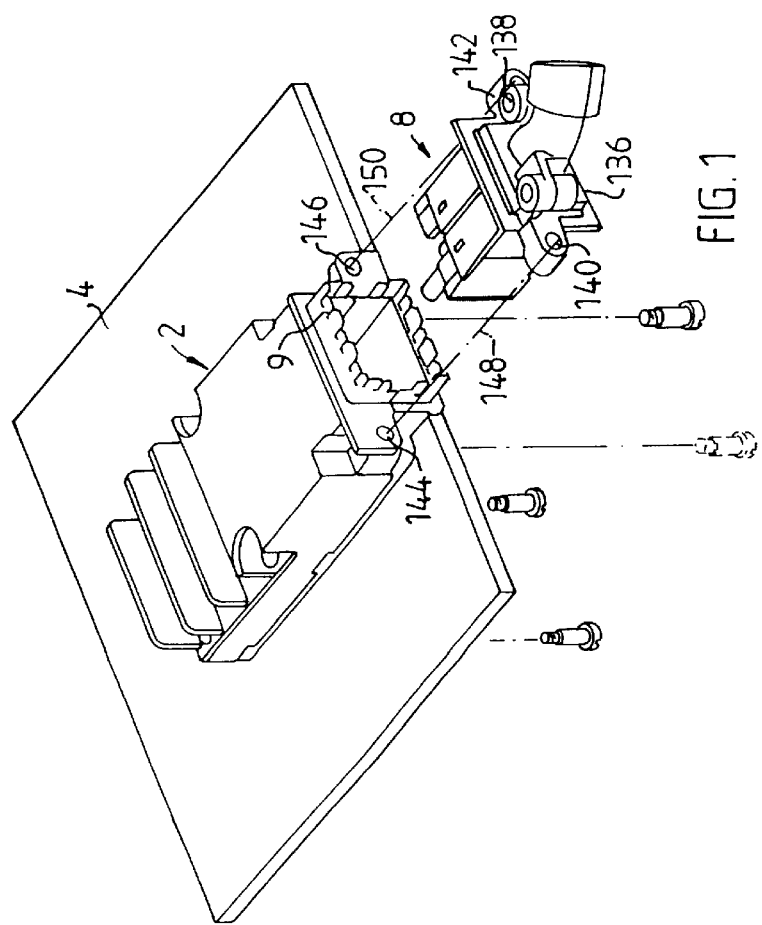
FIG. 1 is a perspective view of a housing for an electro-optic circuit mounted on a mother printed circuit card.

FIG. 1 shows the housing for an electro-optic circuit according to the invention, generally designated 2, and mounted on a mother card 4. The housing 2, the design of which appears more closely from FIG. 2, contains connection means in the form of a housing 6 with a receiving tube 7 for receiving one end of an opto conductor. The opto conductor is kept fixedly by a connection device generally designated 8 and received in an opening in a guiding-in part, generally designated 9. The connection device 8 will be described more closely further on.

The housing 6 contains an electro-optic component not shown and comprising optic sender and receiver component parts for transforming an electric output signal to an outgoing optic signal, and for transforming a received opto signal to an electric input signal, respectively. The optic sender and receiver component parts can be combined into a unit, e.g. Duplex-2 from ABB HAFO, that admits use of one single opto fibre for transfer in both directions to and from the electro-optic component.

The housing 2 furthermore encloses a printed circuit card arrangement 10 on which the housing 6 is attached. The printed circuit card arrangement 10 is in the form of a sender/receiver printed circuit card 10 and is henceforth, for the sake of simplicity, denominated "printed circuit card" or, alternatively, "sender/receiver printed circuit card", despite the fact that it, as described below, can consist of a sandwich of two printed circuit cards. The printed circuit card 10 on one side carries a sender circuit 12 for the electric output signal and on the other side a receiver circuit 13 for the electric input signal. The circuits are indicated for the upper side of the card at sender circuit 12 and for the lower side of the card with sender circuit, but are not shown more closely for the rest. The card 10 furthermore carries connections, not shown, between inputs and outputs of the sender and receiver circuits, respectively, on the one hand, and connection pins 14 on the other hand, that extend through the housing to the outside thereof for connection to outer circuits on the mother card 4.

The housing 2 has a lower part 16 and an upper part 18, both metallic, comprising each one half 9a and 9b, respectively, of the guiding in part 9. Between the lower part 16 and the upper part 18, the sender/receiver printed circuit card 10 is located, the housing containing contact means, described more closely below, between the parts of the housing and between the housing and grounding parts of the sender/receiver printed circuit card 10 and the mother card 4, respectively. As will appear more clearly below said grounding parts of the mother card form part of a metallic layer applied in the card in parallel with and between the two sides of the printed circuit card. The printed circuit card 10 can then consist of one single printed circuit card in which the metallic layer is formed by an integrated conducting layer between the sides of the card. The printed circuit card 10 can, however, also be sandwich-like composed of two printed circuit cards connected together side to side via the metallic layer. The metallic layer can also include a magnetic material, e.g. in the form of a nickel plate for shielding against inductive cross-induction. By the design of the housing 2 just described it forms three Faraday's cages. Two of the cages each enclose one of the sender and receiver circuits 12 and 13, respectively, one consisting of the lower part 16 of the housing and the metallic layer of the printed circuit card 10, and the other one consisting of the upper part 18 of the housing and the metallic layer of the printed circuit card. The third cage is the housing 2 in its entirety.

The above mentioned contact means consist of a number of longitudinal spring means 20 along the sides of the housing parts 16 and 18. Each spring means 20 is made in one piece and comprises a number of contact points for the sender/receiver printed circuit card 10, a number of contact points for the housing lower part 16, a number of contact points for the housing upper part 18, and a number of contact points for the mother card 4.

Each spring means has an essentially rib-shaped first web part 22 extending along the longitudinal direction of the spring means. A second web part 24 extends along and at a distance from the first web part 22 and is connected thereto by means of arcuate connection pieces 26 extending from a first side edge 28 of the first web part to a nearby first side edge 30 of the second web part. First contact tongues 32 are bent away from the first side edge 30 of the second web part in a direction towards the first web part 22 and end between the planes of the two web parts. Second contact tongues 34 are arcuately bent away from the first side edge 28 of the first web part 22 in a direction towards the second web part 24 and end outside the plane of the second web part. Each one of the first and one of the second contact tongues 32 and 34, respectively, are arranged pairwise in the spaces between the arcuate connection pieces 26. Third contact tongues 36 are bent away from the second side edge of the first web part 22 in a direction outwardly from the two web parts. Each one of the third contact tongues 36 has an inner leg 38 bent away from the first web part 22 and an outer leg 40 connected thereto and bent away from the inner leg for forming an acute angle between the two legs.

The web part 22 extends between the inside of a side wall 42 standing up from the bottom wall of the lower part 16 and an opposite side edge 44 of the sender/receiver printed circuit card 10. The web part 24 extends between the outside of the side wall 42 of the lower part and the inside of a side wall 46 extending downwardly from the upper wall of the upper part 18. The contact tongues 32 are located in contact with the outside of the side wall 42 of the lower part 16. The contact tongues 34 are located in contact with the inside of the side wall 46 of the housing upper part 18.

The contact tongues 36 extend between and abut grounding parts, not shown, on the lower side of the sender/receiver printed circuit card 10 and the upper side of the mother card 4. The inner leg 38 of each contact tongue 36 has an upper side formed with a contact boss 48, making contact with the grounding part of the sender/receiver printed circuit card 10. The outer leg 40 makes contact with the grounding part of the mother card 4. In FIGS. 4 and 5 the earlier mentioned inner metallic layer 50 of card 10, as well as an outer continuation 52 thereof, that extends outwardly on the edge 28 of the card 10 to its lower side for forming said grounding part of the card 10 there.

In FIGS. 6–10 an embodiment of the connection device 8 is illustrated more closely with respect to its design and function, which is intended for connecting one end of a sheathed opto fibre 60 to the electro-opto component enclosed in the housing 6.

The connection device 8 includes, while referring particularly to FIG. 7, a retaining sleeve 62 for a portion of the fibre connecting to said end of the sheathed opto fibre 60, a supporting structure 64, for the retaining sleeve 62 intended to be fixed with respect to the electro-opto component in a way to be disclosed more closely below, and a spring 66 acting between the retaining sleeve 62 and the supporting structure 64. More particularly, the spring 66 shall, at connection to the electro-opto component in the housing 6, compensate for tolerances in the length direction of the retaining sleeve 62 with respect to the electro-opto component.

In a way to be described more closely below, the spring 66 and the supporting structure 64 are mutually shaped to first admit introduction of the retaining sleeve 62 with the sheathed fibre 60 kept thereby in the direction of the arrow 68, before the spring 66 which may thereupon be introduced in the direction of the arrow 70 and according to the dashed lines 72 and 74 sidewardly in the supporting structure.

The spring 66 is made in one piece of two spring legs 76 and 78 bent into a V-shape and arranged in parallel with and joined together at the end of the leg of the respective V by means of ties 80 and 82, respectively. On location in the supporting structure 64 the spring 66 straddles the retaining sleeve 62 with the V-shaped spring legs 76 and 78 on each side thereof and commonly acting between an abutment 84 on the sleeve 62 extending around the circumference of the sleeve 62, and an abutment 86 in the support structure.

Figure 7:
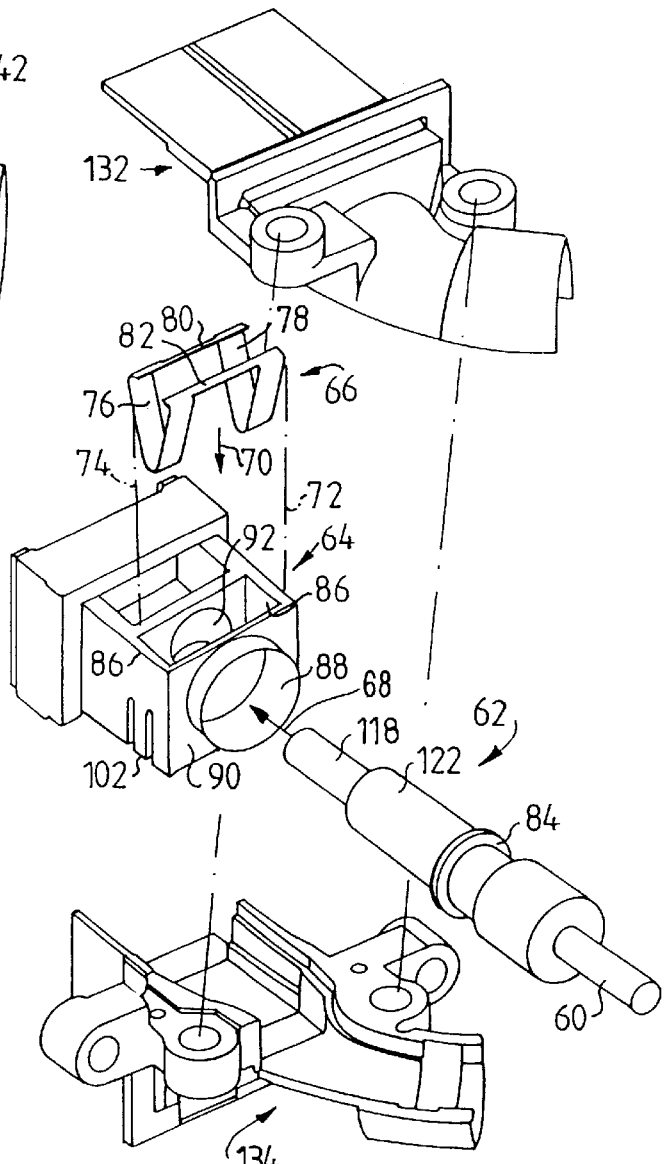
FIG. 7 shows an exploded view of the housing shown in FIG. 6 with the parts thereof as well as components enclosed therein in perspective.
Figure 8:
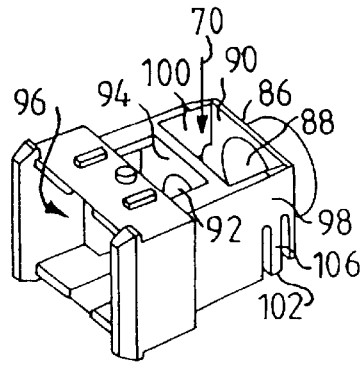
FIG. 8 shows a perspective view of a component enclosed in the housing according to FIGS. 6 and 7 and turned 90° anticlockwise in the same plane as the corresponding perspective view in FIG. 7.
Figure 9:
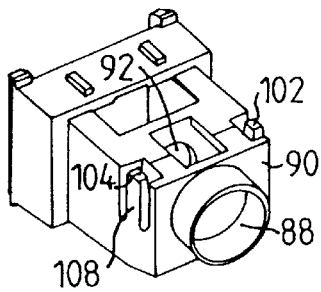
FIG. 9 shows a perspective view of the same component as in FIG. 8, although turned 180° about a length axis with respect to the corresponding perspective view in FIG. 7.

The support structure 64 is essentially cage shaped and comprises, while referring to FIGS. 7–9, a passage for the retaining sleeve 62 extending in the direction of the arrow 68. This passage includes in turn, in the direction of the arrow 68, an opening 88 located in an end wall 90, an opening 92 located in an intermediate wall 94, and an end opening 96, that is located at the other end of the supporting structure 64 with respect to the end wall 90. The end wall 90 and the intermediate wall 94 delimit each an upper edge, as seen in FIGS. 7 and 9, together with sidewalls 98 and 100 extending therebetween, a rectangular side opening towards said passage for introducing the spring 66 in the direction of the arrow 70. As appears from FIG. 9 the abutment 86 is located in this side opening on the side of the end wall 90 facing the side opening.

Figure 10:
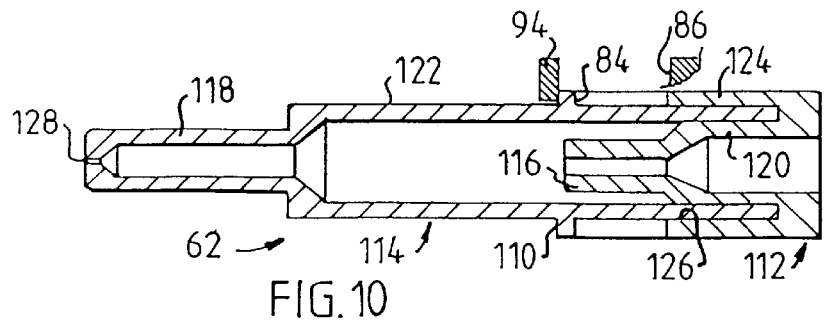
FIG. 10 shows a longitudinal section of another component enclosed in the housing according to FIG. 7.

When located in the supporting structure 64, the spring 66 is kept in place by the edge of the V of the respective V-shaped spring parts 76 and 78 snapping under the free end 102 and 104, respectively, of each a tongue 106 and 108, respectively, formed in each one of the side walls 98 and 100, respectively. The legs of the spring parts 76 and 78 facing the wall 94 then abut the abutment 84 of the sleeve 62 on each side of the sleeve, and the tie 82 of the spring 66 abuts the abutment 86. The abutment 84, which accordingly is located between the walls 90 and 94, forms one side of a radial extension from the sleeve, the other side 110 of which by engagement with the intermediate wall 94 delimits movement of the sleeve 62 in the direction of the arrow 68. Movement of the sleeve 62 in the other direction is limited by the engagement of the spring 66 therewith. In FIG. 10 the locations for the abutment 86 and the intermediate wall 94 with respect to the sleeve 94 are indicated when the sleeve is in its mounted position in the supporting structure 64.

Further referring to FIG. 10, the sleeve is assembled, in the shown embodiment, of two mutually concentric parts, viz. a fibre keeping part 112 and a fibre guiding in part 114. The parts 112 and 114 are both essentially bottle shaped with a neck portion 116 and 118, respectively, and a mantle portion 120 and 122, respectively, with open bottom, the mantle portion 122 carrying the radial extension 84/110. The mantle portion 120 furthermore is surrounded by a collar 124 extending outwardly from its bottom edge and being essentially of the same length as the mantle portion 120 and extending parallel with this so that they delimit a gap 126 between them, the width of which is somewhat greater than the thickness of the mantle portion 122 of the part 114. The parts 112 and 114 are interconnected with the open end portion of the mantle portion 122 extending into the gap 126.

The neck portion 116 of the part 112 serves for clampingly keeping in place the sheathed fibre 60, not shown in FIG. 10, that extends up to the mouth 128 of the neck portion 118. The mouth 128 has a width corresponding to the thickness of the optofibre without sheath.

At mounting the sleeve 62 with the sheathed optofibre 60 sitting fixedly therein, first pulling of a suitable length of the sheathed optofibre through the neck portion 116 and clamping of it in the neck portion 116 by means of a suitable clamping tool is performed. Thereupon the part of the optofibre extending out of the neck portion 116 is cut to a length that is greater than the distance between the outer ends of the neck portions 116 and 118 when the sleeve 62 is ready-assembled. Thereupon the end of the optofibre is uncovered by removing a suitable length of its mantle, glue is applied on a portion of the end of the mantle portion 122 turned away from its neck portion 118, and this end is introduced into the gap 126 to the bottom thereof. This is done while simultaneously securing that the uncovered fibre end is guided into the mouth 128 so that it will at last protrude therefrom. The end thus protruding is then cut along the end surface of the neck portion 118.

A conceivable and advantageous alternative to the embodiment of the sleeve 62 shown in FIG. 10 and described above, is that the part 114 is replaced by a layer directly sprayed onto the part 112 and the sheathed optofibre clamped therein and having the same contours as the part 122 when required. The part 112 is then suitably modified so that the collar 124 disappears.

The parts 62–66 are dimensioned and mutually shaped in a way that in their ready-assembled state the support structure 64 surrounds the sleeve 62 essentially over a portion thereof that extends from the rear end of the sleeve 62 up to the transition between the mantle portion 122 and the neck portion 118.

Figure 2:
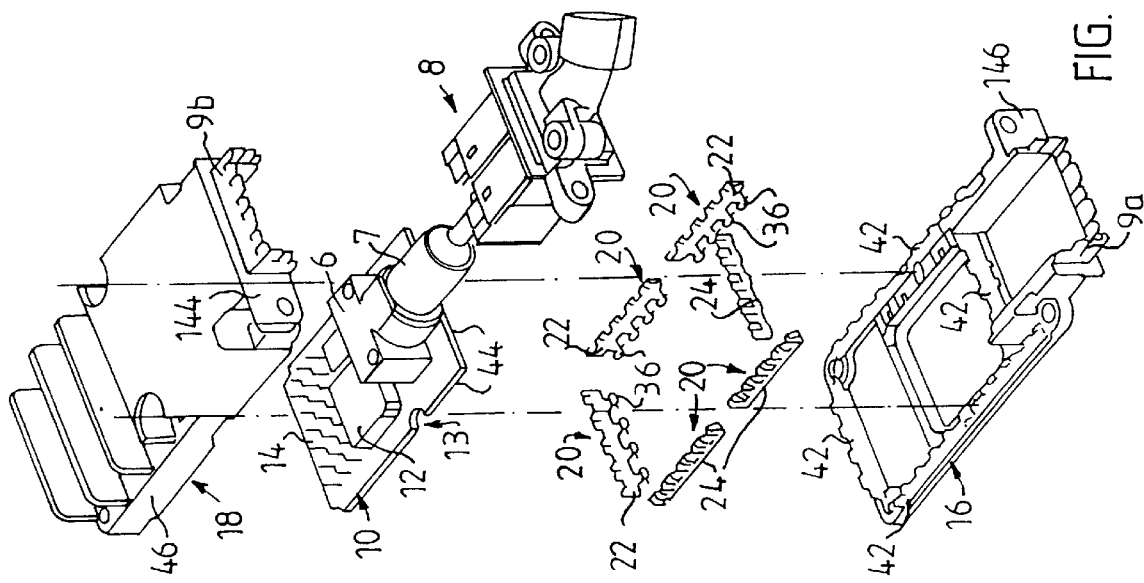
FIG. 2 shows an exploded view of the housing shown in FIG. 1 with the parts thereof as well as components enclosed thereby being shown in perspective.
Figure 6:
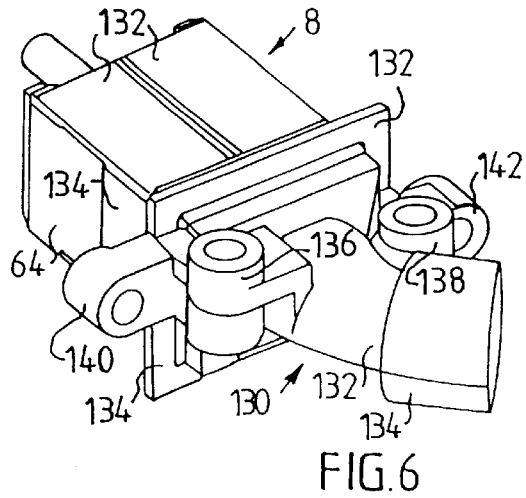
FIG. 6 shows a perspective view of a housing for a contact means.

The parts 62–66 are enclosed in an outer housing with a pipe socket 130 united therewith into one piece, via which the sheathed optofibre 60 is guided into the sleeve 62. The housing is shown in FIG. 7 as divided into an upper housing half 132 and a lower housing half 134, which in FIG. 6 are shown in a state mounted by means of screw connections 136 and 138. In FIGS. 1 and 2 the same view of the connecting device 8 is shown as in FIG. 6. At 140 and 142 ears extending from each of the housing halves 132 and 134, respectively, are shown containing screw holes. Referring also to FIGS. 1 and 2 the upper part 18 and the lower part 16 of the housing 2 have correspondingly extending ears 144 and 146, respectively, provided with screw holes. The ears 140 and 144 provided with holes with a screw passing therethrough, on the one hand, and the ears 142 and 146 provided with holes with a screw passing therethrough, on the other hand, each form a screw joint for joining, according to the dashed lines 148 and 150, respectively, the contact device 8 with the housing 2, with the housing 130/132 guided into the guiding-in part 9. In this position the mouth 128 of the sleeve 62 in the housing 6 is in a correct position with respect to the electro-optic component enclosed therein. The receiving tube 7 then extends into the support structure 64 approximately up to its intermediate wall 94, tolerances of the retaining sleeve 62 in its length direction with respect to the electro-optic component being taken up by the spring 66.

What is claimed is:

1. A contact spring, comprising a longitudinal spring structure shaped in one piece having a first substantially strip-shaped web portion that extends along the longitudinal direction of the spring structure;

a second web portion extending along and at a distance from the first web portion and being united with this by arcuate connection pieces that extend from a first side edge of one of the web portions to an adjacent first side edge of the other web portion;

first contact tongues bent from the first side edge of the second web portion in a direction towards the second web portion and ending between the planes of the two web portions;

second contact tongues arcuately bent from the first side edge of the first web portion in a direction towards the second web portion and ending outside the plane of the second web portion; and third contact tongues bent from the second side edge of the first web portion in a direction outwardly from the two web portions.

2. The contact spring of claim 1, wherein the first and the second contact tongues are pairwise arranged in spaces between the arcuate connection pieces between the web portions.

3. The contact spring of claim 2, wherein each of the third contact tongues has a first inner leg bent out from the first web portion and an outer leg connecting to this and bent out from the inner leg for forming an acute angle between the two legs.

4. A device in an electro-optic circuit, comprising:

a module for the electro-optic circuit having an electromagnetically shielded housing that contains a double-sided printed circuit card arrangement that carries circuit components located shielded from each other on one side each by an electrically conducting shielding that is in connection with the housing; and contact means provided between the housing and grounding portions of the printed circuit card arrangement, the shielding between a sender and a receiver, and an outer printed circuit card on which the module is attachable;

wherein the housing has a lower portion and an upper portion between which the printed circuit card arrangement is located; the contact means comprises a number of longitudinal spring means disposed along insides of the lower and upper portions; each longitudinal spring means is shaped in one piece and has a number of contact points for the printed circuit card arrangement, a number of contact points for the lower portion, a number of contact points for the upper portion, and a number of contact points for the outer printed circuit card.

5. The device of claim 4, wherein each longitudinal spring means has a first web portion that extends along the longitudinal direction of the spring means between the inside of a round about extending side wall of the lower portion and a side edge, facing this side wall, of the printed circuit card arrangement;

a second web portion that extends between an outside of a side wall of the lower portion and an inside of a round about extending side wall of the upper portion;

a first contact tongues bent away from an upper edge of the second web portion for contact with the outside of the side wall of the lower portion;

second contact tongues bent away from an upper edge of the first web portion for contact with the inside of the side wall of the upper portion; and third contact tongues extending between and abutting the grounding portions of the printed circuit card arrangement and the outer printed circuit card.

6. The device of claim 5, wherein the first and second web portions are interconnected by arcuate connection pieces extending over the side wall of the lower portion, and a first and a second contact tongue are pairwise arranged in spaces between the connection pieces.

7. The device of claim 5, wherein each of the third contact tongues has an inner leg bent away from the first web portion in between the printed circuit card arrangement and the outer printed circuit card, an upper side of which is shaped for contact with the grounding portion of the printed circuit card arrangement, and an outer leg that is bent away from the inner leg under an acute angle in direction towards the outer printed circuit card for making contact with the grounding portion thereof.

* * * * *